United States Patent [19]

Logan et al.

[11] 3,993,963
[45] Nov. 23, 1976

[54] HETEROSTRUCTURE DEVICES, A LIGHT GUIDING LAYER HAVING CONTIGUOUS ZONES OF DIFFERENT THICKNESS AND BANDGAP AND METHOD OF MAKING SAME

[75] Inventors: Ralph Andre Logan, Morristown; Franz Karl Reinhart, Summit, both of N.J.

[73] Assignee: Bell Telephone Laboratories, Incorporated, Murray Hill, N.J.

[22] Filed: June 20, 1974

[21] Appl. No.: 481,244

[52] U.S. Cl. .......................... 331/94.5 H; 357/16; 357/18
[51] Int. Cl.[2] .......................................... H01S 3/19
[58] Field of Search ............... 331/94.5; 357/16, 18; 148/171, 172, 175

[56] References Cited
UNITED STATES PATENTS

| | | | |
|---|---|---|---|
| 3,565,702 | 2/1971 | Nelson | 148/172 |
| 3,741,825 | 6/1973 | Lockwood et al. | 148/171 |
| 3,747,016 | 7/1973 | Kressel et al. | 331/94.5 |
| 3,758,875 | 9/1973 | Hayashi | 331/94.5 |

Primary Examiner—William L. Sikes
Attorney, Agent, or Firm—Michael J. Urbano

[57] ABSTRACT

Described is a double heterostructure (DH) junction laser in which the intermediate layer in which light is guided is composed of an active and a passive zone which are disposed in tandem along the direction of light propagation. The active zone is thin and has a relatively narrow bandgap, and the passive zone is thicker and has a wider bandgap. The transition in thickness and bandgap between zones is relatively gradual. Also described is a monolithic integrated circuit including a DH laser and a DH modulator which have such an intermediate layer in common. In addition, described is an LPE growth technique for fabricating the intermediate layer in which two solutions, used to grow simultaneously zones of different composition, are placed on opposite sides of a partition which bifurcates one of the wells of the growth apparatus. The passive zone grows under the partition. In order to reduce mixing between the solutions, a pair of saturating seeds, separated by a divider which is aligned with the partition, are used to bring the bottoms of the two solutions to saturation.

20 Claims, 7 Drawing Figures

HETEROSTRUCTURE DEVICES, A LIGHT GUIDING LAYER HAVING CONTIGUOUS ZONES OF DIFFERENT THICKNESS AND BANDGAP AND METHOD OF MAKING SAME

BACKGROUND OF THE INVENTION

This invention relates to semiconductor heterostructure devices, such as double heterostructure (DH) junction lasers, and to liquid phase epitaxy (LPE) growth techniques for fabricating such devices.

An active device such as a GaAs-AlGaAs DH junction laser and passive device such as a waveguide are typically similar in composition and impurity doping. However, it is difficult as a practical matter to physically join such active and passive devices together in an integrated circuit with suitable isolation because the laser radiation which is emitted at energies near the GaAs bandgap is highly attenuated in a passive waveguide of identical composition. In order to transmit the radiation emanating from a GaAs LED or DH laser, the light guiding layer of the waveguide must be transparent to the generated light. That is, the light guiding layer should be constructed out of a semiconductor with a higher effective bandgap than GaAs. In practice this requirement means that the active region in the GaAs laser should change relatively abruptly to AlGaAs at the active-to-passive interface, but not so abruptly that significant reflections occur at the interface due to impedance mismatch.

SUMMARY OF THE INVENTION

In accordance with one aspect of our invention, LPE growth apparatus has been designed which has enabled us to fabricate heterostructure devices, such as junction lasers, in which the intermediate layer in which light is guided is composed of an active and a passive zone disposed in tandem along the direction of light propagation (e.g., along the resonator axis). The active zone is thin (e.g., 1 $\mu$m) and has a relatively narrow bandgap (e.g., that of GaAs) whereas the passive zone is thicker (e.g., 4 $\mu$m) and has a wider bandgap (e.g., that of $Al_{0.1}Ga_{0.9}As$). The transition between zones is graded in both thickness and composition or bandgap. In addition to utilizing different materials to achieve the difference in bandgap between the active and passive zones, it is also possible to utilize a single material (e.g., GaAs) in which suitable doping modifies the effective bandgap in the zones.

A DH junction laser incorporating such a layer, with a passive zone formed at one or both of the mirrors, is capable of fundamental transverse mode, high power pulsed (or lower power c.w.) operation with significantly reduced output beam divergence. Moreover, if the output mirror is formed along a plane beyond the point of maximum thickness of the passive zone, then the output beam is inherently focussed, a property which enhances coupling into other components such as optical fibers.

In an integrated circuit, the passive zones can also be used to provide coupling between, for example, a DH laser of the type described above and a DH modulator of the type described by F. K. Reinhart in U.S. Pat. No. 3,748,597 issued on July 24, 1973. Electrical isolation between components of the circuit can be provided, for example, by selective etching or by local irradiation damage.

In order to effect LPE growth of such devices our growth apparatus was constructed so that one of the wells of the solution holder was bifurcated by a thin partition which had a relatively high thermal conductivity and which was not wetted by the growth solutions. A solution containing materials to grow a narrow bandgap first zone of the intermediate layer (e.g., GaAs) was placed in the bifurcated well on one side of the partition, and another solution containing materials to grow a wider bandgap second zone of the intermediate layer (e.g., AlGaAs) was placed in the bifurcated well on the other side of the partition. When the growth seed (e.g., GaAs) was positioned under the bifurcated well, growth from both solutions proceeded simultaneously. Growth also occurred under the partition, but because of its higher thermal conductivity the local temperature was somewhat cooler. Consequently, growth under the partition took place at a faster rate, resulting in a thicker transition zone (e.g., AlGaAs) being formed thereunder.

Illustratively, we have fabricated layers which included a 1 $\mu$m thick $Al_{0.03}Ga_{0.97}As$ first zone and a 1 $\mu$m thick $Al_{0.20}Ga_{0.80}As$ second zone separated by an $Al_xGa_{1-x}As$ transition zone having a length of about 30 mils (750 $\mu$m). Within the transition zone the aluminum composition increased monotonically from $X = 0.03$ at one end of the zone to $x = 0.20$ at the other end of the zone. The thickness however, increased monotonically from about 1 $\mu$m at one end of the zone to about 5 $\mu$m at the center and then decreased monotonically to about 1.5 $\mu$m at the other end. In the context of the previously described DH laser, the first zone corresponds to the active zone and the transition zone, when one of the mirrors is formed by cleaving at a point therein, corresponds to the passive zone. With respect to the integrated circuit, the transition zone provides coupling between the active zone and the second zone which is incorporated as the waveguide of the DH modulator.

Also described hereinafter is an additional feature of our growth procedure in which a conventional saturation seed, which is slid under the solutions just prior to growth, is replaced by a pair of saturation seeds separated from one another by a divider in the seed holder. The seed divider is aligned with the solution partition in order to reduce mixing between the solutions in the bifurcated well.

For convenience we have employed the abbreviation AlGaAs to mean a ternary compound of the form $Al_xGa_{1-x}As$.

BRIEF DESCRIPTION OF THE DRAWING

Our invention, together with its various features and advantages, can be readily understood from the following more detailed description taken in conjunction with the accompanying drawing, in which.

DETAILED DESCRIPTION

Figure 1:
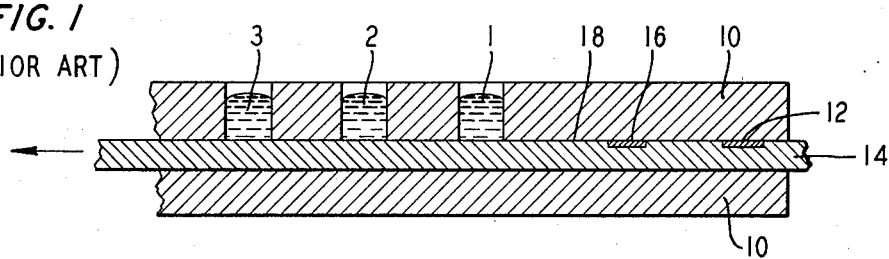
FIG. 1 is a partial cross-sectional view of prior art apparatus used in LPE growth techniques.

Before discussing our invention in detail, it will be helpful to review briefly a prior art LPE technique of the type described by H. C. Casey, Jr. et al., in *Journal of Applied Physics*, Vol. 45, page 322 (January 1974). As shown in FIG. 1 herein, this technique commonly utilizes a graphite solution holder 10 having a plurality of wells (three are shown designated 1, 2 and 3) each of which contains a source solution for growing sequentially a plurality of epitaxial layers on a suitable seed. A growth seed 12 on which the epitaxial layers are grown is inserted in a recess in a slider 14 which is slideably inserted in a channel in the solution holder. In addition, a saturation seed 16 is also inserted in another recess in the slider 14. The slider is moved in a direction (right to left in FIG. 1) so that saturation seed 16 is positioned under each well prior to the growth seed 12 being so positioned in order to bring to saturation the bottom portion of each solution prior to actual growth of the seed 12. As is well known in the art, the top of the growth seed 12 is separated from the top surface 18 of the slider 14 by a small gap typically about 2 mils in height.

In order to grow a double heterostructure junction laser, for example, the seeds 12 and 16 are typically n-type GaAs, well 1 contains a Ga solution of Al and GaAs plus an n-type dopant such as Sn; well 2 contains a Ga solution of GaAs plus a p-type dopant such as Si; and well 3 contains a Ga solution of Al and GaAs plus a p-type dopant such as Ge. Illustratively, the three layers grown from these three solutions comprise n-$Al_{0.25}Ga_{0.75}As$, p-GaAs and p-$Al_{0.25}Ga_{0.75}As$ and are 2 $\mu$m, 0.5 $\mu$m and 2 $\mu$m thick, respectively. These layers are epitaxially grown on the seed 12 when the apparatus of FIG. 1 is placed in a suitable furnace, heated to approximately 800° C and a controlled cooling program of approximately 0.1° C per minute is instituted.

It should be noted that the intermediate layer (i.e., p-GaAs) grown by the foregoing prior art technique is substantially uniform in thickness over relevant dimensions (e.g., over 400 $\mu$m, a typical length of a junction laser resonator).

Figure 2:
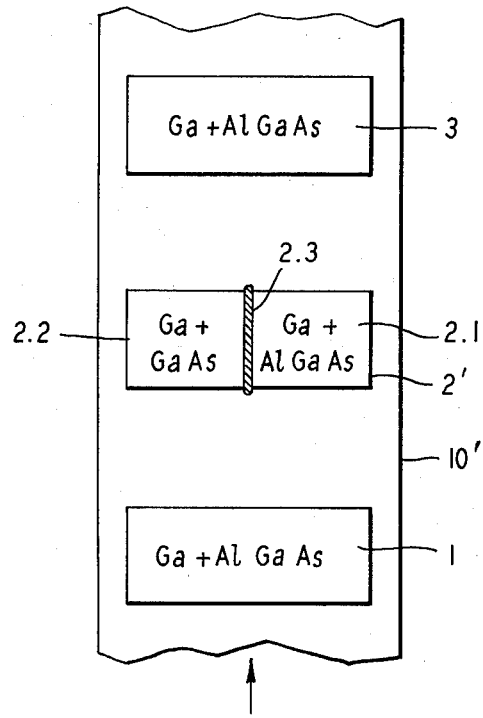
FIG. 2 is a top view of the solution holder of FIG. 1 modified to provide a bifurcated well in accordance with one embodiment of our invention.

In accordance with one embodiment of our invention, the apparatus of FIG. 1 is modified in order to fabricate layers which have first and second zones of different material composition joined by a thicker localized transition zone. In the transition zone the thickness and composition are graded from the first zone to the second zone. In order to effect growth of such layers, we constructed a solution holder 10' of the type shown in FIG. 2 in which the well 2' was provided with a thin partition 2.3 which bifurcated the well into a pair of wells 2.1 and 2.2. The partition was oriented parallel to the direction of motion of the slider (seed holder) in order to reduce solution mixing caused by the motion of the slider. The partition should have a relatively high thermal conductivity so that the solution thereunder will be cooler and thus growth will be faster. Moreover, the partition should be made of a material not wetted by Ga because a wetted surface may cause competing GaAs crystal growth which reduces the nearby growth in the layer being grown. Suitable materials for the partition include carbon and BN. Using these materials, smooth transitions in composition from the first zone (grown from the solution in well 2.2) to the second zone (grown from the solution in well 2.1) have been achieved using partitions of various thicknesses in the range of 3 to 20 mils and also with the lower edge sometimes beveled to a bottom thickness as small as 1 mil. The shape and width of the partition is determined by the desired width and thickness of the transition zone. The bottom of the partition was typically spaced from the top of the growth seed by about 2 mils.

Growth of the transition zone under the partition occurs because the Ga source solution wets the AlGaAs layer grown from the solution in well 1. The surface tension effects produced by the partition are thus overcome and only a small amount of solution mixing occurs in the region under the partition. Keeping the growth plane isothermal reduces the likelihood that any significant stirring of the solutions will occur and thus insures that mixing of Al between the solutions in the bifurcated well will be diffusion limited.

Figure 4A:
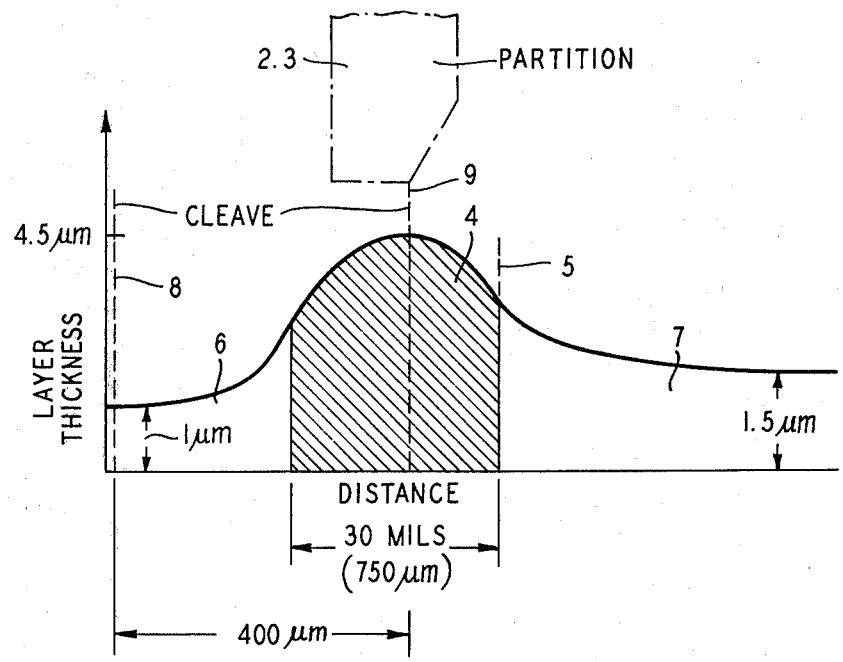
FIGS. 4A and 4B show how the thickness and Al composition, respectively, vary in an AlGaAs layer grown from solutions in th bifurcated well of FIG. 2;
the FIG. 5 is a schematic side view of a DH junction laser in accordance with one embodiment of our invention.
Figure 4B:
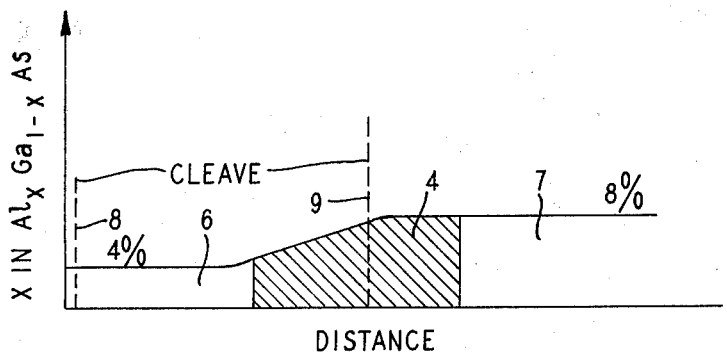

An illustrative example of a layer grown on a (100) GaAs substrate in accordance with the foregoing procedure is shown in FIGS. 4A and 4B. FIG. 4A shows the thickness profile (exaggerated for clarity) of the layer in a direction perpendicular to the partition 2.3 whereas FIG. 4B shows the Al concentration profile of the layer in the same dimension. This layer was grown using a graphite partition which was 20 mils wide and slightly tapered on the side adjacent to well 2.1. The shaded portion 4 depicts the transition zone which was approximately 30 mils wide and had a maximum thickness of about 4.5 $\mu$m. The laterally adjacent first and second zones 6 and 7 were about 1 $\mu$m thick. The first zone 6 comprised $Al_{0.04}Ga_{0.96}As$ whereas the second zone comprised $Al_{0.08}Ga_{0.92}As$. As shown in FIG. 4B in the transition zone 4 the Al composition increased monotonically from 4 percent to 8 percent.

Several experiments were performed to establish the above-described growth results. In a first set of experiments, the photoluminescence of the layer shown in FIGS. 4A and 4B was tested on both sides of the transition zone. The peak of the luminescence spectra indicated that the difference in Al concentration on either side of the transition zone was about 4 percent. The magnitude of this concentration difference demonstrates the effectiveness of the partition in providing separation between the solutions in the bifurcated wells (i.e., Al separation). These results were corroborated by exciting a double heterostructure waveguide, which incorporated the layer of FIG. 4 as its light guiding layer, with white light propagating parallel to the partition (perpendicular to the plane of the paper) and observing the absorption edge. Excitation of waveguide modes perpendicular to the partition demonstrated that the waveguide region is continuous and that the tapering indeed does not adversely affect propagation. In a second set of experiments, electroluminescence and lasing properties of the layer of FIG. 4 were investigated. Luminescence spectra were found to change according to the Al content change across the transition zone. Double heterostructure lasers were constructed from both the first and second zones 6 and 7. The lasing energies differed by 45 meV which again confirmed an Al concentration difference of about 4 percent.

Figure 3:
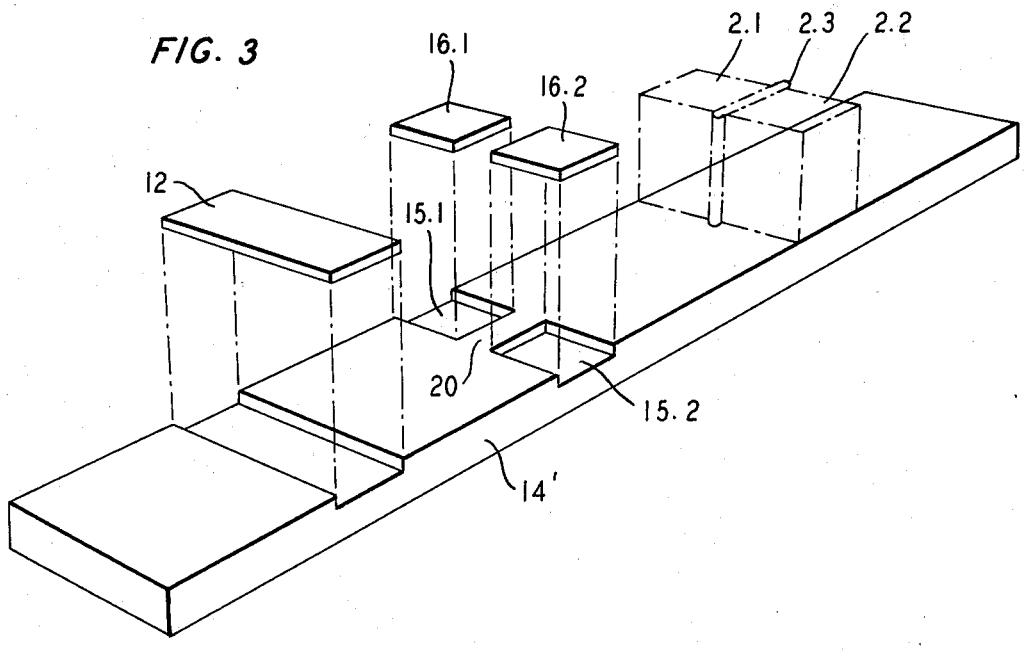
FIG. 3 is a pictorial view of the seed holder (slider) of FIG. 1 modified to reduce mixing of solutions in the bifurcated well of FIG. 2 in accordance with another embodiment of our invention.

As discussed previously, wetting of the priorly grown AlGaAs layer (from the solution in well 1) by the separate solutions in the bifurcated well 2' permits layer growth underneath the partition which separates the solutions 2.1 and 2.2. This same wetting may cause some mixing between the solutions in the bifurcated well and should be reduced as much as possible for better composition control in the layer. In the prior art procedure described with reference to FIG. 1, it was pointed out that layer growth is improved by first positioning a saturating seed 16 under each solution prior to growth on the growth seed 12. However, the use of this single saturating seed under both solutions in the bifurcated well contributes to mixing between the two solutions. We have found that the use of a pair of saturating seeds in the modified slider 14' shown in FIG. 3 reduces considerably the mixing between the solutions in the bifurcated well. More specifically, the saturation seed recess in the slider 14' is provided with a carbon divider 20 aligned with the partition 2.3 in the solution holder 10. Divider 20 therefore forms a pair of recesses 15.1 and 15.2 for carrying the saturating seeds 16.1 and 16.2, respectively. Consequently, the solutions in the bifurcated well do not join during the saturation step thereby resulting in significant improvement in composition separation between the layers grown on either side of the partition 2.3. Illustrative results are as follows. First, with a conventional single saturating seed (FIG. 1) but with a bifurcated well 2' (FIG. 2) intended to grow GaAs in the first zone and $Al_{0.10}Ga_{0.90}As$ in the second zone, we in fact obtained $Al_{0.04}Ga_{0.96}As$ and $Al_{0.08}Ga_{0.92}As$, respectively. In contrast, with a pair of saturating seeds (FIG. 3) and a bifurcated well (FIG. 2) intended to grow GaAs in the first and $Al_{0.20}Ga_{0.80}As$ in the second zone, we in fact obtained $Al_{0.03}Ga_{0.97}As$ and $Al_{0.20}Ga_{0.80}As$, respectively.

While the foregoing description relates a specific embodiment in which a single partition was used to fabricate a single transition zone, it is possible to use a plurality of partitions to fabricate more than one such transition zone separating a plurality of first and second zones of different compositions.

Figure 5:
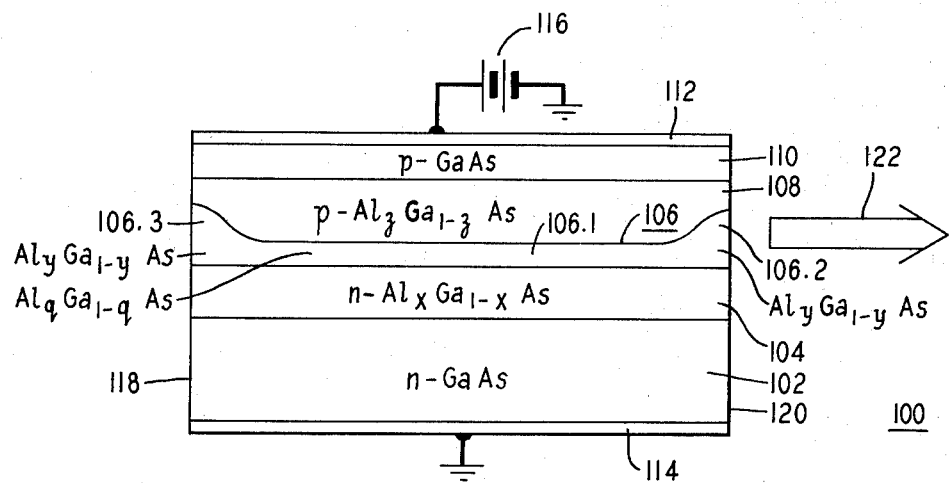

For example, FIG. 5 shows a schematic side view of a double heterostructure junction laser 100 which may be fabricated utilizing the foregoing techniques of our invention. Illustratively, the laser 100 comprises an n-GaAs substrate 102 on which are grown the following epitaxial layers in the order recited: an $n-Al_xGa_{1-x}As$ layer 104, a light guiding layer 106, a $p-Al_zGa_{1-z}As$ layer 108, and a p-GaAs layer 110 used to facilitate the making of electrical contact to the device. Metal contacts 112 and 114 are formed on layer 110 and substrate 102, respectively, by evaporation or other means well known in the art.

In operation laser 100 is forward biased illustratively by means of a battery 116 connected across contacts 112 and 114. When the current supplied by battery 116 exceeds the lasing threshold, stimulated coherent radiation is generated by radiative recombination of holes and electrons in layer 106. This radiation emanates from one of both of the end faces 118 and 120 which may be either cleaved or polished optically flat to form a cavity resonator. One or more heat sinks (not shown) may be thermally coupled to either major surface (layer 112 or substrate 102) or both to facilitate removal of heat from the laser.

In accordance with one embodiment of our invention, the DH laser 100 is characterized in that layer 106 includes a relatively thin narrow bandgap active zone 106.1 and at least one thicker wider bandgap passive zone 106.2 adjacent end face 120. Such a structure has been formed by cleaving along the planes shown by the dotted lines 8 and 9 in FIG. 4. Optionally, the layer 106 may include a second passive zone 106.3 located adjacent end face 118. As mentioned previously, layer 106 with two passive zones may be fabricated by using two partitions in well 2' of solution holder of FIG. 2. FIG. 5 shows two such passive zones each of which comprises $Al_yGa_{1-y}As$, $y < x$ and $z$. In addition, the active zone 106.1 is shown as comprising $Al_qGa_{1-q}As$, $q < y$. Of course, the active zone could be GaAs ($q = 0$) and, in addition, the entire layer 106 could be either n-type, p-type or both conductivity types depending on the location of the p-n junction. In general, the AlGaAs layers can include other components to form quaternary instead of ternary layers. For example, the layers of the double heterostructure might be fabricated from $Al_xGa_{1-x}R$ where R includes at least As (e.g., $Al_xGa_{1-x}As_{1-y}P_y$).

In an illustrative embodiment of our invention we constructed a double heterostructure according to FIG. 5 but utilized only a single passive zone. In this example the approximate parameters were as follows: $x = z = 0.25$, $q = 0.04$ and $y = 0.08$. Layer 104 was doped n-type with Sn, layer 106 was n-type but not intentionally doped, and layer 108 was doped p-type with Ge. The thickness of the active zone 106.1 was about 1 $\mu$m whereas the maximum thickness of the passive zone was about 4.5 $\mu$m. This structure was formed by cleaving along planes such as those shown by the dotted lines 8 and 9 in FIG. 4. For such lasers, the threshold current density was about $5 \times 10^3 A/cm^2 \cdot \mu m$, if homogeneous pumping is assumed. Laser radiation was observed as being generated only from the GaAs active zone 106.1 because any radiation which might be generated in the passive zone 106.2 would be absorbed by the lower bandgap GaAs active zone 106.1. Thus, the double heterostructure of the type shown in FIG. 5 lases with a wavelength determined by the narrower bandgap active zone 106.1. Because the passive zone 106.2 contains Al, and thereby exhibits a higher fundamental absorption edge, it need not be pumped at all except near the active zone. Thus, despite the relatively large thickness of the passive zone, the threshold of the laser increased only slightly compared to prior art lasers with a uniformly thick (1 $\mu$m) active region.

The differential quantum efficiency of our lasers was about 15 percent. However, larger values should be achievable by reducing the length of passive zone 106.2 and by increasing the Al concentration differential and gradient between the active and passive zones.

The DH laser 100 of FIG. 5, as well as one which includes a single passive zone only, provides several important advantages. First, the diffraction limited radiation of the thicker passive zone has a considerably narrower divergence angle than that of the narrower active zone. The beam divergence depends on the order of the transverse modes. For our lasers, which had a single passive zone, the beam divergence angle measured between the half-power points of the far field pattern was 30° and 86° for radiation emanating from the passive and active zones, respectively. The emission from the narrower active zone is identical to that of a conventional DH laser oscillating in the same transverse mode as our structure. Secondly, the optical power density at the mirror surfaces (118 and 120) is considerably reduced because of the larger thickness of the passive zones. Consequently, the threshold for catastrophic mirror damage is considerably increased. The ultimate power available from this structure is therefore determined by the maximum power density which the active zone is able to withstand without damage. Thirdly, the DH laser 100 is capable of fundamental transverse mode operation (perpendicular to the junction plane) because the mode pattern is determined primarily by the thickness of the active zone. If this zone is less than about 1 $\mu$m thick, the device will operate in a fundamental transverse mode. Thus, the feature of high power, fundamental mode operation are achieved in a device which may be operated either c.w. or pulsed. Fourthly, the DH laser 100 has negligible current flow near the mirrors because of the increased potential barrier in the $Al_yGa_{1-y}As$ regions 106.2 and 106.3. Following the observations of B. I. Miller and C. A. Burrus, *Optics Communications* Vol. 4, page 307 (1971) using luminescent DH diodes constructed to limit current flow to the central area (away from edges), their diodes exhibited unusually long operating lifetime without failure. It is therefore expected that lasers constructed according to the description of FIG. 5 should be considerably more reliable.

In another embodiment of our invention, the output mirror (surface 120) may be formed by cleaving along a plane corresponding to line 5 of FIG. 4, i.e., on the downwardly sloping side of the passive zone thickness profile which is remote from the first zone 6 (active zone 106.1 of FIG. 5). It can be shown that the shape of such a passive zone produces focusing of the output beam 122, a feature particularly useful in coupling the beam into other optical components such as optical fibers. The characteristic focusing so obtained is equivalent to placing a positive focusing lens outside of the mirror of a conventional laser.

Figure 6:
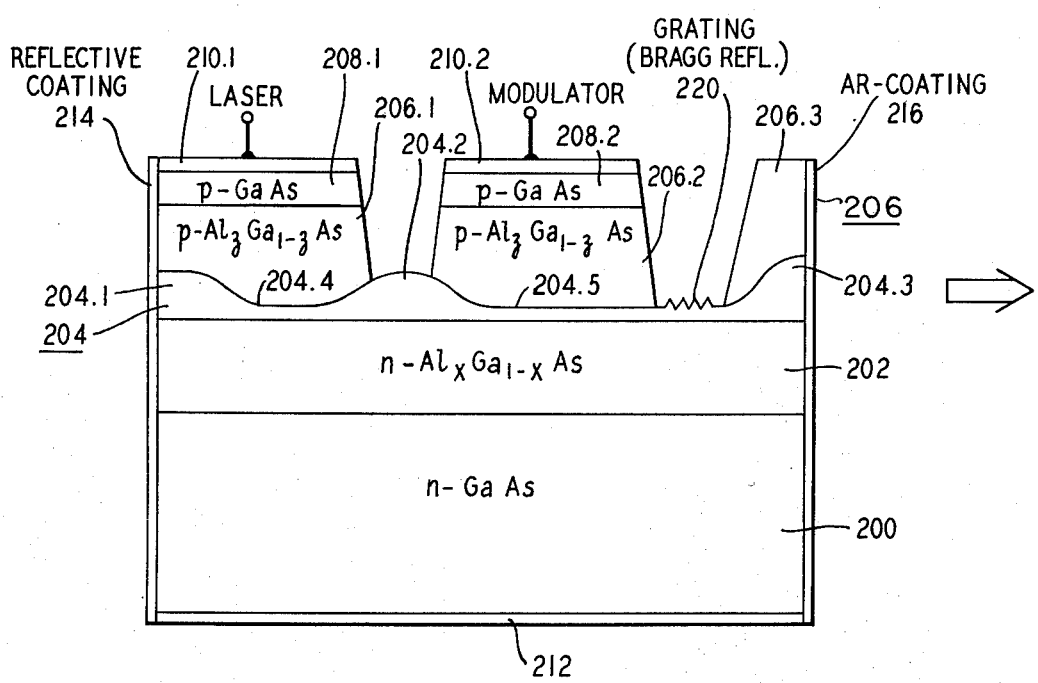
FIG. 6 is a schematic side view of an integrated optical circuit in accordance with another embodiment of our invention.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the foregoing layers having first and second zones of different material composition joined by a thicker localized transition zone can be incorporated into an integrated optical circuit. One such circuit, shown in FIG. 6, illustratively comprises an n-GaAs substrate 200 on which are grown an n-$Al_xGA_{1-x}As$ layer 202 and an intermediate layer 204 having transition (passive) zones 204.1, 204.2, and 204.3 separated from one another by first and second (active) zones 204.4 and 204.5, respectively. Grown epitaxially over layer 204 is a p-$Al_zGa_{1-z}As$ layer 206. Illustratively the passive zones comprise $Al_yGa_{1-y}As$ ($y < x$ and $z$), active zone 204.4 comprises $Al_mGa_{1-m}As$ and active zone 204.5 comprises $Al_nGa_{1-n}As$ ($0 < n < x, y$ and $z, n > m$). Layer 204 may be either n-type, p-type, or both conductivity types depending on the location of the p-n junction.

Layer 206 is shown separated into three electrically isolated portions 206.1, 206.2 and 206.3. The isolation of layer 206 can be effected either by selective etching (e.g., by neutral $H_2O_2$ as described by J. C. Dyment, R. A. Logan and B. Schwarts in U.S. Pat. No. 3,801,391 (Case 6-19-15) issued on Apr. 2, 1974 to selectively remove a portion of the p-GaAs layer 208 and by boiling in HCl or in an iodine etchant at room temperature to selectively remove the underlying portion of the $Al_zGa_{1-z}As$ layer 206. A suitable iodine etchant comprises a solution of 65 gm iodine, 0.25 lb potassium iodide dissolved in 100 cc of water) or by local irradiation damage (e.g., by proton bombardment as described by L. A. D'Asaro, J. C. Dyment, M. Kuhn and S. M. Spitzer in copending application Ser. No. 204,222 (Case 10-4-6-3) filed on Dec. 2, 1971 and assigned to the assignee hereof; now U.S. Pat. No. 3,824,133, issued on July 16, 1974).

Contacting layers of p-GaAs 208.1 and 208.2 are formed on the p-$Al_zGa_{1-z}As$ portions 206.1 and 206.2, respectively. Metal contacts 210.1 and 210.2 are formed in conventional fashion on the contacting layers 208.1 and 208.2, and a metal contact 212 is also formed on the substrate 200. One cleaved surface of the device is provided with a reflective coating 214 and an opposite parallel cleaved surface is provided with an antireflective coating 216 (e.g., ZnS and $Al_2O_3$ layers of the type described by B. W. Hakki in copending application Ser. No. 348,161 (Case 10) filed on Apr. 5, 1973 and assigned to the assignee hereof; now U.S. Pat. No. 3,849,738, issued Nov. 19, 1974). These two cleaved surfaces may form a cavity resonator.

A DH laser is formed from n-$Al_xGa_{1-x}As$ layer 202, $Al_mG_{1-m}As$ active zone 204.4 and p-$Al_zGa_{1-z}As$ portion 206.1. Assume hereinafter that $m = O$ so that active zone 204.4 is GaAs. The laser includes passive portions 204.1 and 204.2 at opposite ends of the active zone 204.4. In tandem with the DH laser is an intracavity DH modulator of the type described by F. K. Reinhart in Case 2, supra. This modulator basically includes n-$Al_xGA_{1-x}As$ layer 202, $Al_nGa_{1-n}As$ active zone 204.5, and p-$Al_zGA_{1-z}As$ portion 206.2. An optional grating 220 (Bragg reflector) is formed on the surface of layer 204 between the output of the modulator and the AR coating 216, although its location within the resonator is not critical. The grating 220 acts as a longitudinal mode selector. If the AR coating 216 is efficient, the cavity resonator will actually be defined by the reflective coating 214 and the grating 220. Therefore, the need for cleaved mirrors can be eliminated altogether if a second grating (not shown) is fabricated in a thin passive zone (not shown) to the left of passive zone 204.1. In addition, the Bragg reflector may serve as a converter of frequency modulation into intensity modulation.

In operation, the DH laser generates radiation at a wavelength determined by the GaAs active zone 204.4 (e.g., about 0.9 $\mu$m). This radiation advantageously oscillates in a fundamental transverse mode (perpendicular to the junction or growth plane) if the thickness of the active zone 204.4 is less than about 1 $\mu$m. As is well known in the art, fundamental transverse mode operation parallel to the junction plane is effected by making contact 210.1 in the form of a stripe no greater than about 13 $\mu$m wide. Alternatively, this type of mode control can be achieved using a rib-waveguide structure formed by double anodization as described by R. A. Logan and B. I. Miller in copending application Ser. No. 434,286 (Case 20-3) filed on Jan. 17, 1974 and assigned to the assignee hereof; now U.S. Pat. No. 3,859,178, issued on Jan. 7, 1975. As discussed with reference to FIG. 5, the passive zones 204.1 and 204.3 increase the threshold for catastrophic damage thus permitting the laser to operate at relatively high power. The radiation generated in the GaAs active zone 204.4 of the laser is coupled into the $Al_nGa_{1-n}As$ active zone 204.5 of the modulator by means of transition zone 204.2. This radiation may be either intensity of phase modulated in the modulator by applying a suitable forward or reverse bias, respectively, to the contacts 210.2 and 212. The output of the modulator passes through the grating 220 which is utilized for well known frequency selection purposes. The modulated and filtered radiation subsequently emanates from the passive zone 204.3 through the AR coating 216 to a utilization means (not shown).

In an illustrative embodiment of our invention we constructed an integrated circuit of the type shown in FIG. 6 but utilized only the laser and modulator portions, omitting the grating 220 the passive zones 204.1 and 204.3 and the coatings 214 and 216. The layers 202 and 206 had about 25 and 45 percent Al, respectively. The active zones 204.4 and 204.5 had about 4 and 8 percent Al, respectively. The thickness of zones 204.4, 204.2 and 204.5 were about 1.5 $\mu$m, 11 $\mu$m and 1.8 $\mu$m, respectively. It was observed that a voltage applied to the modulator in this integrated device varied both the laser intensity and lasing frequency. For example, with the laser forward biased to operate just above threshold, a one volt reverse bias on the modulator caused lasing to cease. Conversely, with the laser biased just below threshold a one volt forward bias on the modulator caused lasing to occur. With the laser operating at a power level well above threshold (e.g., 20 percent) a reverse bias voltage on the modulator changed the laser oscillation frequency. For example, with a reverse bias of 20 volts applied to the modulator, the laser oscillation wavelength changed in excess of 2 Angstroms.

What is claimed is:

1. A double heterostructure device comprising first and second wide bandgap layers, and a third narrower bandgap layer intermediate to and contiguous with said first and second layers, said third layer being transparent to optical radiation passing therethrough, characterized in that said third layer includes a narrow bandgap first zone and at least one relatively thicker wider bandgap transition zone in tandem therewith along the direction of radiation transmission.

2. The device of claim 1 for use as a junction laser wherein said first layer is n-type, said second layer is p-type, and including a pair of spaced parallel surfaces perpendicular to the direction of propagation of said radiation forming a cavity resonator, said at least one transition zone being located within said resonator and adjacent one of said surfaces (the output mirror) from which an output beam of said radiation emanates.

3. The device of claim 2 wherein said transition zone is characterized by a thickness which increases monotonically from the thickness of said first zone to a peak thickness, said output mirror being formed at said peak thickness approximately.

4. The device of claim 2 wherein said transition zone is characterized by a thickness which first increases monotonically from the thickness of said first zone to a peak thickness and then decreases monotonically, said output mirror being formed at a point where said thickness is decreasing, thereby to focus said output beam.

5. The device of claim 2 including a pair of said transition zones, one of which is located adjacent each of said surfaces.

6. The device of claim 2 wherein the thickness of said first zone is not greater than approximately 1 $\mu$m.

7. The device of claim 2 wherein said first layer comprises $n\text{-}Al_xGa_{1-x}R$, said second layer comprises $p\text{-}Al_zGa_{1-z}R$, said transition zone comprises $Al_yGa_{1-y}R$, and said first zone comprises $Al_qGa_{1-q}R$, where R includes at least As, $O < y < x$ and $z$; $O = q < x$ and $z$; and $y < q$.

8. The device of claim 7 wherein $q < 0$ and said first zone comprises GaAs.

9. An integrated optical circuit comprising a first wide bandgap layer, a second wide bandgap layer having a conductivity type opposite to that of said first layer; means defining at least two electrically isolated segments of said second layer, a third layer intermediate to and contiguous with said first and second layers, said third layer including at least two narrow bandgap active zones and at least three relatively wider bandgap passive zones, said third layer being transparent to optical radiation propagating therein, a pair of spaced parallel surfaces perpendicular to the direction of propagation of said radiation, one of said passive zones separating said active zones from one another, and the other of said passive zones separating each of said active zones from separate ones of said surfaces, each of said electrically isolated segments of said second layer overlaying a separate one of said active zones, said first layer, one of said segment and its underlying active zone forming a double heterostructure junction laser, and said first layer, the other of said segments and the other of said active zones forming an intracavity double heterostructure junction modulator.

10. The integrated circuit of claim 9 including a least one Bragg reflector grating formed on a portion of the surface of said third layer.

11. The integrated circuit of claim 9 including a reflective coating on one of said parallel surfaces and an antireflective coating on the other of said parallel surfaces.

12. The integrated circuit of claim 9 wherein said first layer comprises $n\text{-}Al_xGa_{1-x}R$, said second layer comprises $p\text{-}Al_zGa_{1-z}R$, said one active zone comprises $Al_mGa_{1-m}R$, said other active zone comprises $Al_nGa_{1-n}R$ and said passive zones comprise AlGaAs with more Al therein than in the active zones adjacent thereto but less than in said first and second layers, and wherein $O$ $m < n$; $m < x$ and $z$; $n < x$ and $z$; and R includes at least As.

13. A method of fabricating a layer having zones of different bandgaps and thicknesses comprising the steps of epitaxially growing simultaneously spaced apart a first zone of semiconductive material having a first bandgap and a second zone of semiconductive material having a second bandgap different from that of the first zone while simultaneously growing at a faster rate in the region intermediate the first and second zones a thicker transition zone having a bandgap intermediate that of the first and second zones by maintaining the local temperature cooler in said intermediate region.

14. A liquid phase epitaxy method of fabricating a layer having a first zone of one material composition, a second zone of another material composition and a transition zone which is thicker than said first and second zones and which has a material composition and thickness which grades from said first zone to said second zone, said method being carried out in an apparatus which includes a solution holder having at least one well for carrying a source solution and a seed holder having a recess for carrying a growth seed, said solution and seed holders being movable relative to one another in order to bring said solution and said seed into contact with one another, said apparatus being placed in a furnace, heated to an elevated temperature, and controllably cooled to effect growth, said method being CHARACTERIZED BY the steps of:
a. partitioning said at least one well by means of a thin partition which bifurcates said well into first and second wells;
b. placing a first source solution in said first well;
c. placing a second source solution in said second well; and
d. bringing said solutions and said seed into contact with one another so that said first zone is grown from said first solution, said second zone is grown from said second solution, and said transition zone is grown beneath said partition.

15. The method of claim 14 wherein step (a) includes partitioning said at least one well by means of a thin partition which is fabricated from a material not wet by said source solution.

16. The method of claim 15 wherein step (a) includes partitioning said at least one well by means of a thin partition which is fabricated from a material selected from the group consisting of C and BN; and steps (b) and (c) include placing first and second source solutions both of which include Ga.

17. The method of claim 14 wherein step (a) includes partitioning said at least one well by means of a thin partition the bottom of which adjacent the source solution is bevelled.

18. The method of claim 14 wherein said seed holder includes another recess bifurcated by a divider into second and third recesses for carrying a pair of saturating seeds, said divider being alignable with said partition, said method comprising the further steps of: prior to step (d), placing a pair of saturating seeds in said second and third recesses; and bringing said source solutions and said saturating seeds into contact so that said partition is aligned with said divider in order to substantially reduce the amount of mixing between said first and second source solutions.

19. The method of claim 14 wherein step (b) includes placing a first source solution which comprises a Ga solution including GaAs and an amount of Al, including zero, in said first well; and step (c) includes placing a second source solution which comprises a Ga solution including a GaAs and a non-zero amount of Al, greater than the amount of aluminum in said first solution, in said second well.

20. The method of claim 19 wherein said solution holder includes at least two additional wells for carrying third and fourth solutions effective to grow a first AlGaAs layer and a second AlGaAs layer, said method comprising the further steps of:

prior to step (d), bringing said third solution and said growth seed into contact with one another so that said first AlGaAs layer is grown on said growth seed; and after step (d), bringing said fourth solution and said layer grown from step (d) into contact with one another so that said second AlGaAs layer is grown thereon.

* * * * *

UNITED STATES PATENT AND TRADEMARK OFFICE
CERTIFICATE OF CORRECTION

PATENT NO. : 3,993,963
DATED : Nov. 23, 1976
INVENTOR(S) : Ralph A. Logan and Franz K. Reinhart It is certified that error appears in the above-identified patent and that said Letters Patent are hereby corrected as shown below:

```
Column  3, line  2, delete "the";
           line 28, "of" second occurrence should be --on--.
Column  7, line 15, "feature" should be --features--;
           line 68, "Schwarts" should be --Schwartz--.
Column  8, line 31, "The" should be --This--.
Column 10, claim  7, line  7, "=" should be --≤--;
                     line  8, "y < q" should be --y > q--;
           claim  8, line  9, "<" should be --=--;
           claim 10, line 36, "a" should be --at--;
           claim 12, line 50, before "m" insert --≤--.
```

Signed and Sealed this

Eighth Day of March 1977

[SEAL]

Attest:

RUTH C. MASON
Attesting Officer

C. MARSHALL DANN
Commissioner of Patents and Trademarks